(12) United States Patent  
Lin et al.

(10) Patent No.: US 9,281,312 B2  
(45) Date of Patent: Mar. 8, 2016

(54) NON-VOLATILE MEMORY WITH A SINGLE GATE-SOURCE COMMON TERMINAL AND OPERATION METHOD THEREOF

(71) Applicant: YIELD MICROELECTRONICS CORP., Hsinchu County (TW)

(72) Inventors: Hsin-Chang Lin, Hsinchu County (TW); Ya-Ting Fan, Hsinchu County (TW); Wen-Chien Huang, Hsinchu County (TW)

(73) Assignee: Yield Microelectronics Corp., Chu-Pei, Hsinchu County (TW)

( * ) Notice: Subject to any disclaimer, the term of this patent is extended or adjusted under 35 U.S.C. 154(b) by 30 days.

(21) Appl. No.: 14/325,549

(22) Filed: Jul. 8, 2014

(65) Prior Publication Data

US 2016/0013194 A1    Jan. 14, 2016

(51) Int. Cl.

| | |
|---|---|
| H01L 27/115 | (2006.01) |
| H01L 49/02 | (2006.01) |
| H01L 29/423 | (2006.01) |
| H01L 29/788 | (2006.01) |
| G11C 16/12 | (2006.01) |
| G11C 16/14 | (2006.01) |

(52) U.S. Cl.  
CPC .......... *H01L 27/11521* (2013.01); *G11C 16/12* (2013.01); *G11C 16/14* (2013.01); *H01L 27/11558* (2013.01); *H01L 28/40* (2013.01); *H01L 29/42324* (2013.01); *H01L 29/788* (2013.01)

(58) Field of Classification Search  
CPC ................... H01L 27/11558; H01L 29/42324; H01L 29/788  
See application file for complete search history.

(56) References Cited

U.S. PATENT DOCUMENTS

| | | | |
|---|---|---|---|
| 7,099,192 B2 * | 8/2006 | Wang ................ | G11C 16/0416 257/316 |
| 7,423,903 B2 * | 9/2008 | Lin ...................... | H01L 27/115 257/316 |
| 7,787,295 B2 * | 8/2010 | Liu ...................... | H01L 27/112 365/185.01 |
| 8,975,679 B1 * | 3/2015 | Chen ................ | H01L 27/11558 257/298 |
| 2007/0241392 A1 * | 10/2007 | Lin ................... | G11C 16/0416 257/316 |
| 2008/0035973 A1 * | 2/2008 | Lin ...................... | H01L 27/115 257/298 |

* cited by examiner

*Primary Examiner* — Allison P Bernstein  
(74) *Attorney, Agent, or Firm* — Rosenberg, Klein & Lee

(57) ABSTRACT

A non-volatile memory with a single gate-source common terminal and an operation method thereof are provided. The non-volatile memory includes a transistor and a capacitor structure both embedded in a semiconductor substrate. The transistor includes a first dielectric layer, a first electric-conduction gate and several first ion-doped regions. The capacitor structure includes a second dielectric layer, a second electric-conduction gate and a second ion-doped region. The memory may further include a third ion-doped region below the second dielectric layer. The first and second electric-conduction gates are electrically connected to form a single floating gate of the memory cell. The source and second ion-doped region are electrically connected to form a single gate-source common terminal.

16 Claims, 14 Drawing Sheets

NON-VOLATILE MEMORY WITH A SINGLE GATE-SOURCE COMMON TERMINAL AND OPERATION METHOD THEREOF

BACKGROUND OF THE INVENTION

1. Field of the Invention

The present invention relates to a single-gate non-volatile memory and an operation method thereof, particularly to a super low-cost non-volatile memory with a single gate-source common terminal and an operation method thereof.

2. Description of the Related Art

The CMOS (Complementary Metal Oxide Semiconductor) process has been a normal fabrication method for ASIC (Application Specific Integrated Circuit). EEPROM (Electrically Erasable Programmable Read Only Memory), which features electric programmability and erasability and would not lose its memory after power is turned off, has been one of the popular non-volatile memories in the computer and information age.

A non-volatile memory is programmed via keeping charges to vary the gate voltage of the transistor thereof, or not keeping charges to preserve the gate voltage of the transistor. For a non-volatile memory, an erasion operation is to eliminate all the charges kept in the non-volatile memory and restore all the transistors to have the original gate voltages. In the conventional single-gate non-volatile memory, the gate, source and drain are respectively operated by independent voltages. Therefore, the conventional single-gate non-volatile memory has larger area and higher fabrication cost.

Accordingly, the present invention proposes a super low-cost non-volatile memory with a single gate-source common terminal and an operation method thereof to overcome the abovementioned problems, greatly decrease the area of a single-gate non-volatile memory and effectively increase the product value of the single-gate non-volatile memory.

SUMMARY OF THE INVENTION

The primary objective of the present invention is to provide a non-volatile memory with a single gate-source common terminal and an operation method thereof, wherein the single-gate and the source of the transistor of a non-volatile memory is connected to decrease the control gates of the non-volatile memory and reduce the fabrication cost thereof.

To achieve the abovementioned objective, the present invention proposes a non-volatile memory with a single gate-source common terminal and an operation method thereof. The non-volatile memory with a single gate-source common terminal of the present invention comprises a semiconductor substrate, a transistor and a capacitor structure. The transistor and the capacitor structure are disposed on the semiconductor substrate. The transistor includes a first dielectric layer disposed on the semiconductor substrate; a first electric-conduction gate stacked on the first dielectric layer; and two highly-conductive first ion-doped regions formed at two sides of the first electric-conduction gate and the first dielectric layer to function as a source and a drain. Similar to the transistor, the capacitor structure is also disposed to have a sandwich structure. The capacitor structure includes a second ion-doped region formed inside the semiconductor substrate; a second dielectric layer disposed on the lateral side of the second ion-doped region, wherein a channel is formed below the second dielectric layer; and a second electric-conduction gate stacked on the second dielectric layer. The second ion-doped regions and the first ion-doped regions are doped with an identical type of ions. In one embodiment, the capacitor structure further includes a third ion-doped region. The third ion-doped region is doped with the same type of ions as the first and second ion-doped regions. The third ion-doped region is formed below the channel under the second dielectric layer. In one embodiment, the third ion-doped region is extended to the underneath of the second ion-doped regions. The first electric-conduction gate of the transistor and the second electric-conduction gate of the capacitor structure are mechanically separated but electrically connected, jointly functioning as the single-floating gate of the non-volatile memory. Further, the source is electrically connected with the second ion-doped region to form a single gate-source common terminal.

In the present invention, if the semiconductor substrate has the P-type electric conductivity, the first, second and third ion-doped regions have the N-type electric conductivity. If the semiconductor substrate has the N-type electric conductivity, the first, second and third ion-doped regions have the P-type electric conductivity. It should be particularly mentioned herein: any non-volatile memory or operation method derived from the present invention is to be also included within the scope of the present invention.

Below is introduced the operation method of the non-volatile memory with a single gate-source common terminal of the present invention.

In one embodiment, the non-volatile memory with a single gate-source common terminal comprises a P-type semiconductor substrate, a transistor and a capacitor structure. The non-volatile memory with a single gate-source common terminal is written or erased via respectively applying a substrate voltage $V_{sub}$, a control gate-source voltage $V_{cs}$, and a drain voltage $V_d$ to the P-type substrate, the source, and the drain. In writing, $V_{cs}=0V$, $V_d>4V$, and $V_{sub}$ is grounded. In erasing, $V_{cs}>4V$, $V_d<V_{cs}$, and $V_{sub}$ is grounded. Alternatively, in erasing, $V_d>4V$, $V_{cs}<V_d$, and $V_{sub}$ is grounded.

In one embodiment, the non-volatile memory with a single gate-source common terminal comprises an N-type semiconductor substrate, a transistor, a capacitor structure and a P-type well. The non-volatile memory with a single gate-source common terminal is written or erased via respectively applying a substrate voltage $V_{sub}$, a P-type well voltage $V_{pwell}$, a control gate-source voltage $V_{cs}$, and a drain voltage $V_d$ to the N-type substrate, the P-type well, the source, and the drain, wherein the P-type substrate voltage $V_{sub}$ is a positive voltage. In writing, $V_{cs}=0V$, $V_d>4V$, and $V_{pwell}$ is grounded. In erasing, $V_{cs}>4V$, $V_d<V_{cs}$, and Vpwell is grounded. Alternatively, in erasing, $V_d>4V$, $V_{cs}<V_d$, and $V_{pwell}$ is grounded.

In one embodiment, the non-volatile memory with a single gate-source common terminal comprises an N-type semiconductor substrate, a transistor and a capacitor structure. The non-volatile memory with a single gate-source common terminal is written or erased via respectively applying a substrate voltage $V_{sub}$, a control gate-source voltage $V_{cs}$, and a drain voltage $V_d$ to the N-type substrate, the source, and the drain. In writing, $V_{cs}=V_{sub}$, $V_d=0V$, and $V_{sub}>4V$. In erasing, $V_{cs}=0V$, $V_{sub}>V_d$, and $V_{sub}>4V$. Alternatively, in erasing, $V_d=0V$, $V_{sub}>V_{cs}$, and $V_{sub}>4V$.

In one embodiment, the non-volatile memory with a single gate-source common terminal comprises a P-type semiconductor substrate, a transistor, a capacitor structure and an N-type well. The non-volatile memory with a single gate-source common terminal is written or erased via respectively applying a substrate voltage $V_{sub}$, an N-type well voltage $V_{nwell}$, a control gate-source voltage $V_{cs}$, and a drain voltage $V_d$ to the P-type substrate, the N-type well, the source, and the drain. In writing, $V_{nwell}>4V$, $V_{sub}=0$, $V_{cs}=V_{nwell}$, and $V_d=0V$.

In erasing, $V_{nwell}>4V$, $V_{sub}=0V$, $V_{cs}=0V$, and $V_{nwell}>Vd$. Alternatively, in erasing, $V_{cs}=0V$, and $V_{nwell}>V_d$, $V_d=0V$, and $V_{nwell}>V_{cs}$.

Below, the embodiments are described in detail in cooperation with the attached drawings to make easily understood the objectives, technical contents, characteristics and accomplishments of the present invention.

DETAILED DESCRIPTION OF THE INVENTION

Figure 1:
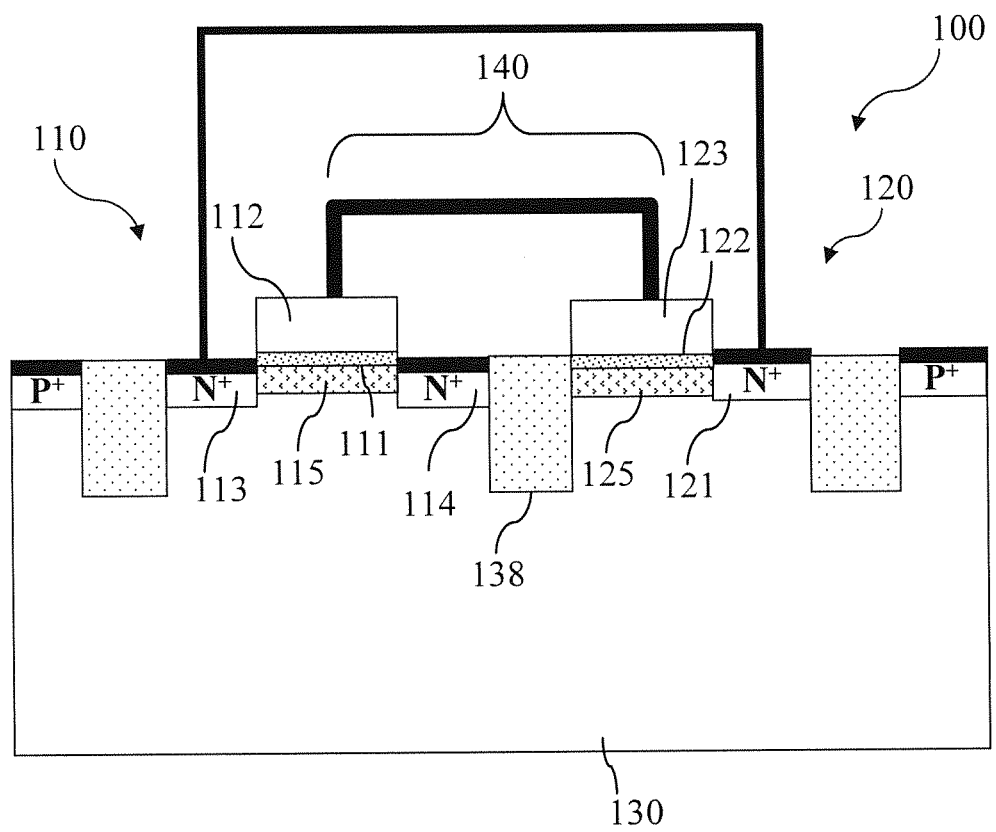
FIG. 1 is a sectional view schematically showing the structure of a non-volatile memory with a single gate-source common terminal according to a first embodiment of the present invention.

Refer to FIG. 1 a sectional view schematically showing the structure of a non-volatile memory with a single gate-source common terminal according to a first embodiment of the present invention.

In the first embodiment, the non-volatile memory 100 with a single gate-source common terminal comprises a P-type semiconductor substrate 130, an NMOS transistor (NMOS-FET) 110 disposed in the P-type semiconductor substrate 130, and an N-type capacitor structure 120 disposed in the P-type semiconductor substrate 130. The NMOS transistor 110 includes a first dielectric layer 111 disposed on the P-type semiconductor substrate 130; a first electric-conduction gate 112 stacked on the first dielectric layer 111; and two first ion-doped regions disposed inside the P-type semiconductor substrate 130 and respectively functioning as a source 113 and a drain 114, wherein a channel 115 is formed between the source 113 and the drain 114. The N-type capacitor structure 120 includes a second ion-doped region 121 disposed inside the P-type semiconductor substrate 130; a second dielectric layer 122 disposed on the lateral side of the second ion-doped region 121, wherein a channel 125 is formed below the second dielectric layer 122; and a second electric-conduction gate 123 stacked on the second dielectric layer 122, whereby is formed a top plate-dielectric layer-bottom plate capacitor structure. The first electric-conduction gate 112 of the NMOS transistor 110 and the second electric-conduction gate 123 disposed on the upper lateral of the N-type capacitor structure 120 are electrically connected but mechanically separated by an isolation material 138 to form a single floating gate 140. Further, the source 113 is electrically connected with the second ion-doped region 121, whereby is formed a single common terminal of the source 113 and the single floating gate 140. In the first embodiment, the first ion-doped regions and the second ion-doped region 121 are N-type ion-doped regions.

Figure 2A:
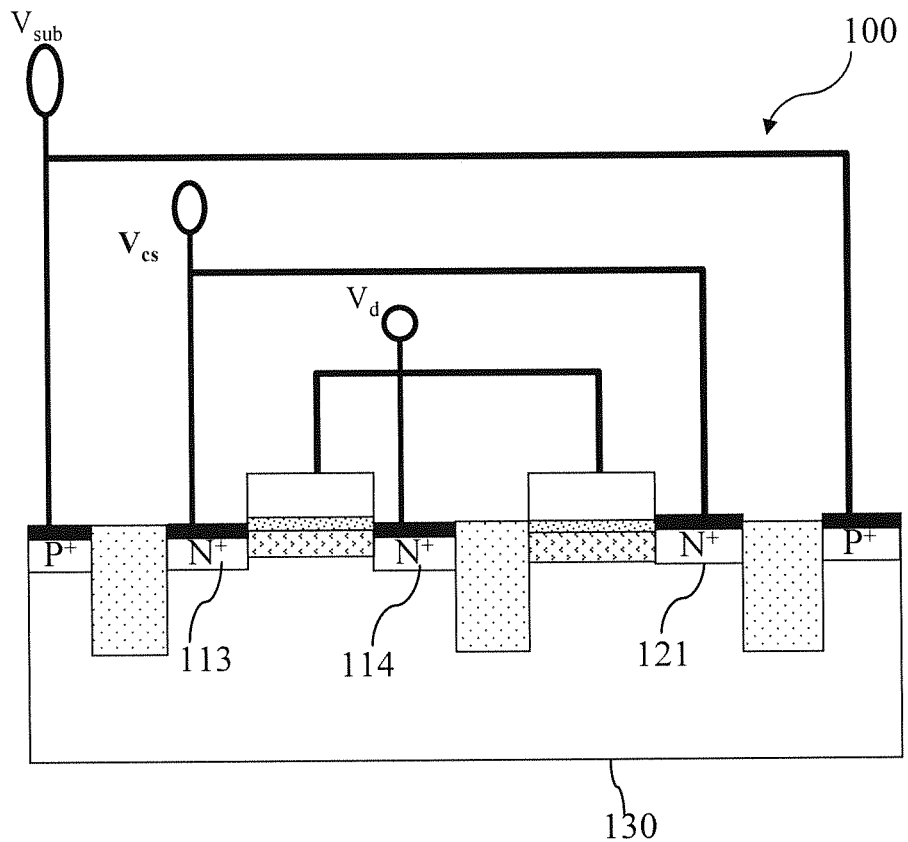
FIG. 2A is a diagram schematically showing t non-volatile memory with a single gate-source common terminal and having three terminals according to the first embodiment of the present invention.
Figure 2B:
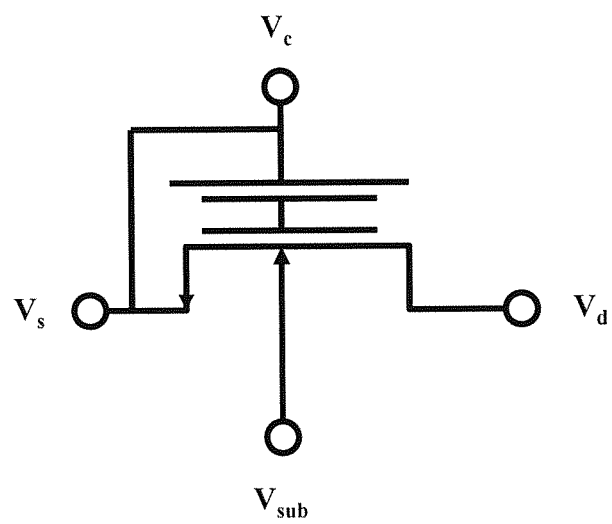
FIG. 2B shows an equivalent circuit of FIG. 2A.

The non-volatile memory 100 with a single gate-source common terminal is a three-terminal structure. Refer to FIG. 2A a diagram schematically showing the non-volatile memory 100 with a single gate-source common terminal and having three terminals according to the first embodiment of the present invention. The three terminals are respectively the P-type semiconductor 130, the source 113 and the drain 114. A substrate voltage $V_{sub}$, a control gate-source voltage $V_{cs}$, and a drain voltage $V_d$ are respectively applied to the P-type semiconductor 130, the source 113 and the drain 114. Refer to FIG. 2B for an equivalent circuit of FIG. 2A. In the first embodiment, the control gate and the source 113 share a common terminal. Therefore, the single floating gate 140 and the source 113 are connected to use a common bias and decrease the control lines of the memory. In the first embodiment, the non-volatile memory 100 with a single gate-source common terminal operates as follows:

In writing,
a. $V_{sub}=0V$ (grounded);
b. $V_{cs}=0V$ and $V_d>4V$.
In erasing,
a. $V_{sub}=0V$ (grounded);
b. $V_{cs}>4V$ and $V_d<V_{cs}$; or $V_d>4V$ and $V_{cs}<V_d$ alternatively.

The structure of FIG. 1 is disposed in a P-type silicon wafer. The isolation structure is disposed with a standard isolation module process. After the basic isolation structure is completed, the channels of the N-type capacitor structure and the NMOS transistor are disposed with an ion implant process. After the dielectric layers of the first and second electric-conduction gates are grown, polysilicon is deposited. Next, a photolithographic process is used to pattern the polysilicon to form the single floating gate. Next, another ion implant process is undertaken to form the electrodes of the NMOS transistor—the drain, source and gate. After metallization, the fabrication of a great number of the non-volatile memory cells with a single gate-source common terminal is completed.

Figure 3A:
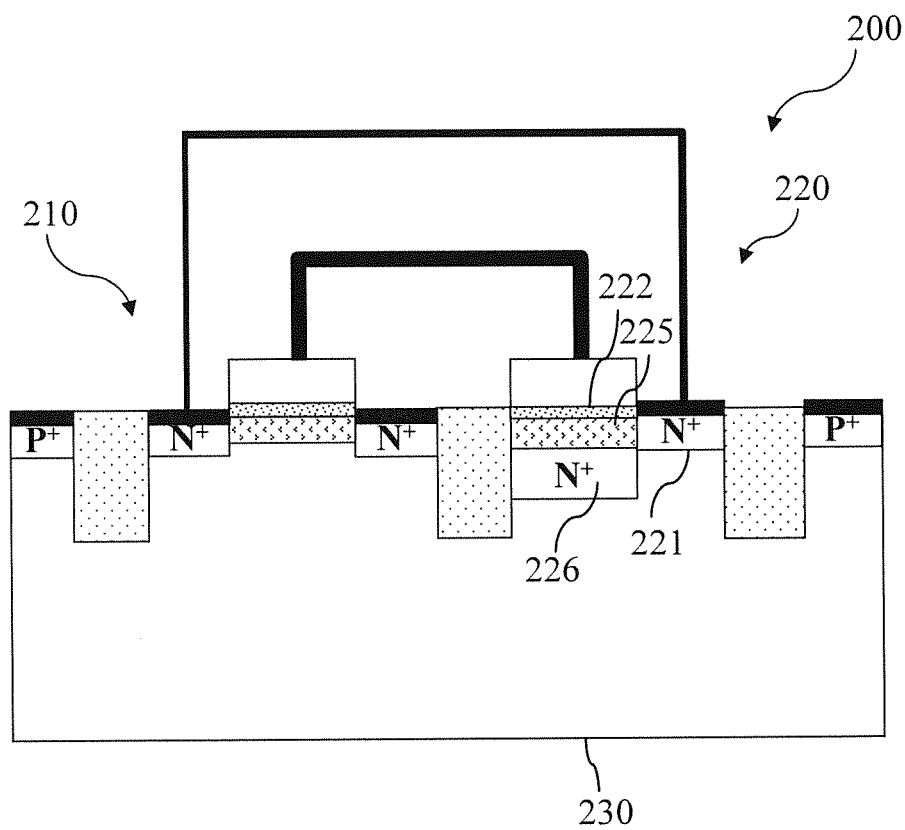
FIG. 3A is a sectional view schematically showing the structure of a non-volatile memory with a single gate-source common terminal according to a second embodiment of the present invention.

Refer to FIG. 3A a sectional view schematically showing the structure of a non-volatile memory with a single gate-source common terminal according to a second embodiment of the present invention.

In the second embodiment, the non-volatile memory 200 with a single gate-source common terminal comprises a P-type semiconductor substrate 230, an NMOS transistor (NMOSFET) 210 disposed in the P-type semiconductor substrate 130, and an N-type capacitor structure 220 disposed in the P-type semiconductor substrate 230. In the second embodiment, both the first ion-doped regions of the NMOS transistor 210 and the second ion-doped region 221 of the N-type capacitor structure 220 are N-type ion-doped regions. The second embodiment is different from the first embodiment in that a third ion-doped region 226 is disposed below the channel 225 under the bottom of the second dielectric layer 222 of the N-type capacitor structure 220. The third ion-doped region is also an N-type ion-doped region.

Figure 3B:
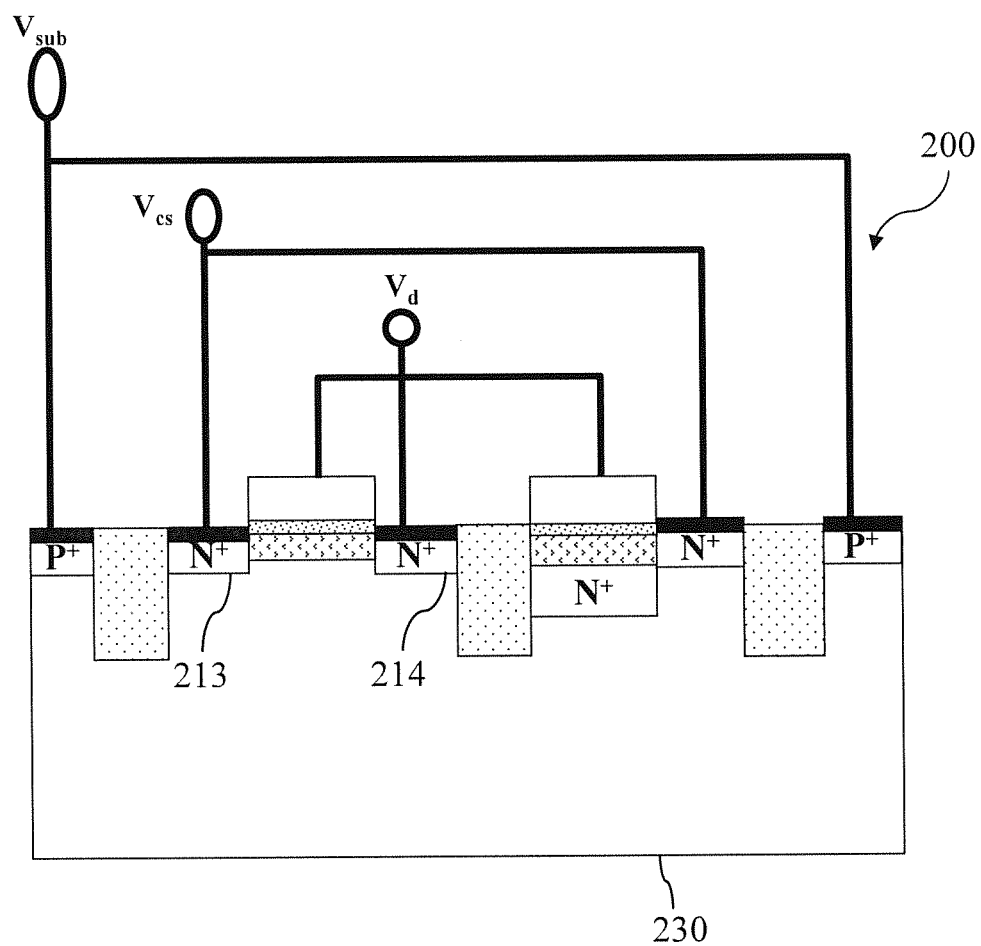
FIG. 3B is a diagram schematically showing non-volatile memory with a single gate-source common terminal and having three terminals according to the second embodiment of the present invention.

Refer to FIG. 3B a diagram schematically showing the non-volatile memory 200 with a single gate-source common terminal and having three terminals according to the second embodiment of the present invention. The three terminals are respectively the P-type semiconductor 230, the source 213 and the drain 214. In writing or erasing the non-volatile memory 200 with a single gate-source common terminal, a substrate voltage $V_{sub}$, a control gate-source voltage $V_{cs}$, and a drain voltage $V_d$ are respectively applied to the P-type semiconductor 230, the source 213 and the drain 214. In the second embodiment, the operation process of the non-volatile memory 200 with a single gate-source common terminal must satisfy the conditions described in the first embodiment.

Figure 4A:
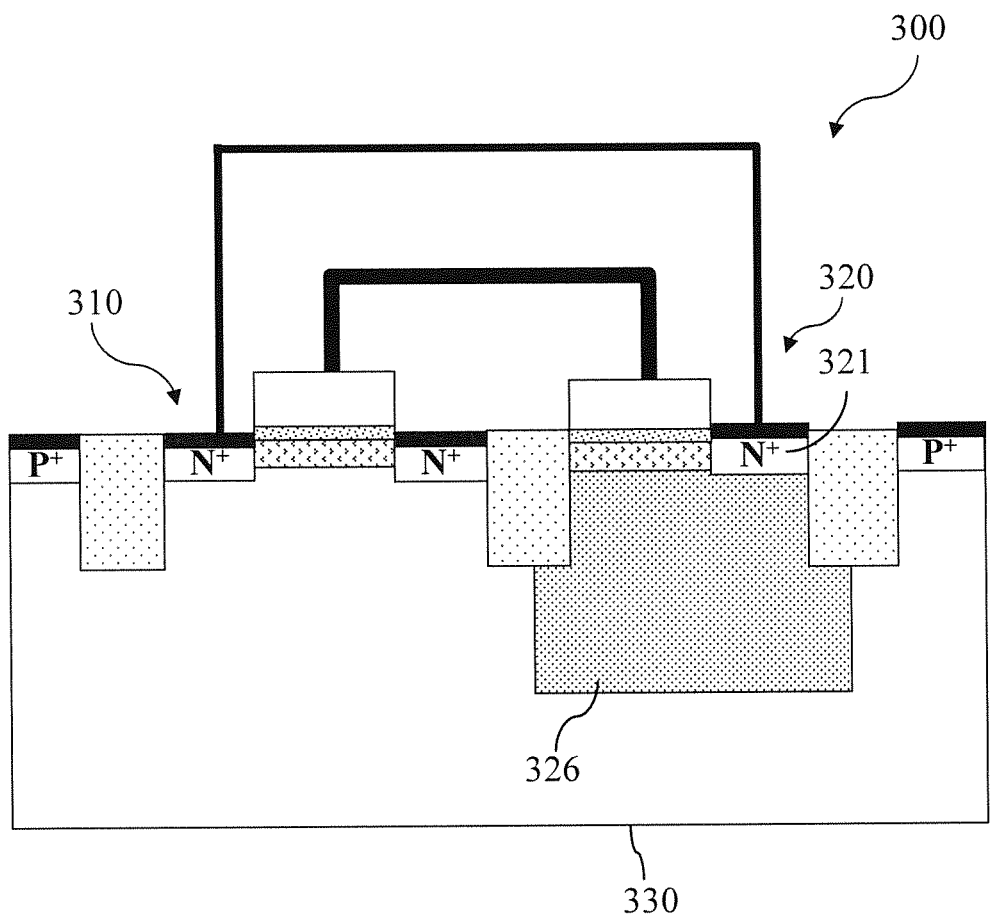
FIG. 4A is a sectional view schematically showing the structure of a non-volatile memory with a single gate-source common terminal according to a third embodiment of the present invention.

Refer to FIG. 4A a sectional view schematically showing the structure of a non-volatile memory with a single gate-source common terminal according to a third embodiment of the present invention.

In the third embodiment, the non-volatile memory 300 with a single gate-source common terminal comprises a P-type semiconductor substrate 330, an NMOS transistor (NMOSFET) 310 disposed in the P-type semiconductor substrate 330, and an N-type capacitor structure 320 disposed in the P-type semiconductor substrate 330. In the third embodiment, the first ion-doped regions, the second ion-doped region 321 and the third ion-doped region 326 are all N-type ion-doped regions. The third embodiment is different from the second embodiment in that the third ion-doped region 326 is extended to below the second ion-doped region 321 to function as an N-type well.

Figure 4B:
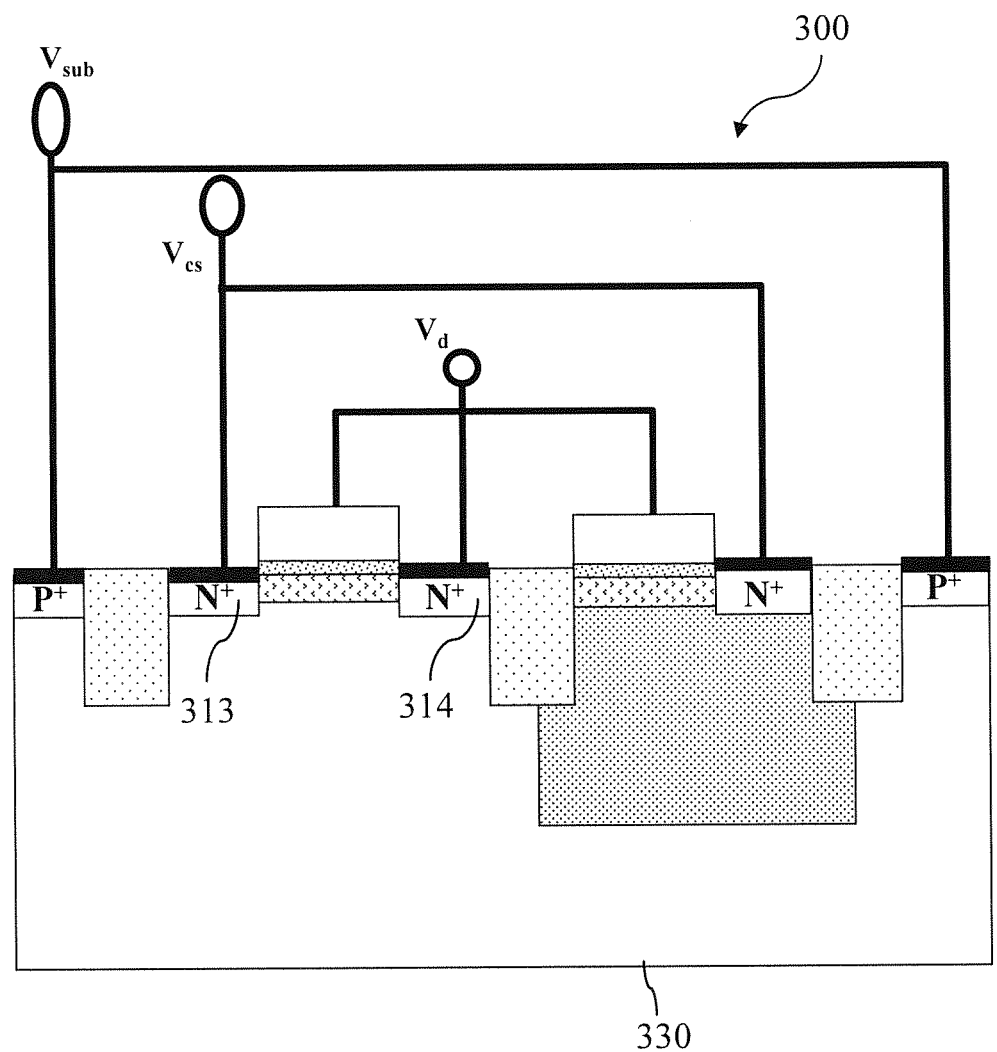
FIG. 4B is a diagram schematically showing the non-volatile memory with a single gate-source common terminal and having three terminals according to the third embodiment of the present invention.

Refer to FIG. 4B a diagram schematically showing the non-volatile memory 300 with a single gate-source common terminal and having three terminals according to the third embodiment of the present invention. The three terminals are respectively the P-type semiconductor 330, the source 313 and the drain 314. In writing or erasing the non-volatile memory 300 with a single gate-source common terminal, a substrate voltage $V_{sub}$, a control gate-source voltage $V_{cs}$, and a drain voltage $V_d$ are respectively applied to the P-type semiconductor 330, the source 313 and the drain 314. In the third embodiment, the operation process of the collinear single gate and source non-volatile memory 300 must satisfy the conditions described in the first embodiment or the second embodiment.

In the present invention, the non-volatile memory with a single gate-source common terminal may alternatively comprise an N-type semiconductor substrate, a transistor and a capacitor structure. Similar to the non-volatile memories with a single gate-source common terminal described above, the non-volatile memory with a single gate-source common terminal and using an N-type semiconductor substrate has or does not have a third ion-doped region below the capacitor structure. Below, a fourth embodiment and a fifth embodiment are used to exemplify the non-volatile memory with a single gate-source common terminal and using an N-type semiconductor substrate.

Figure 5A:
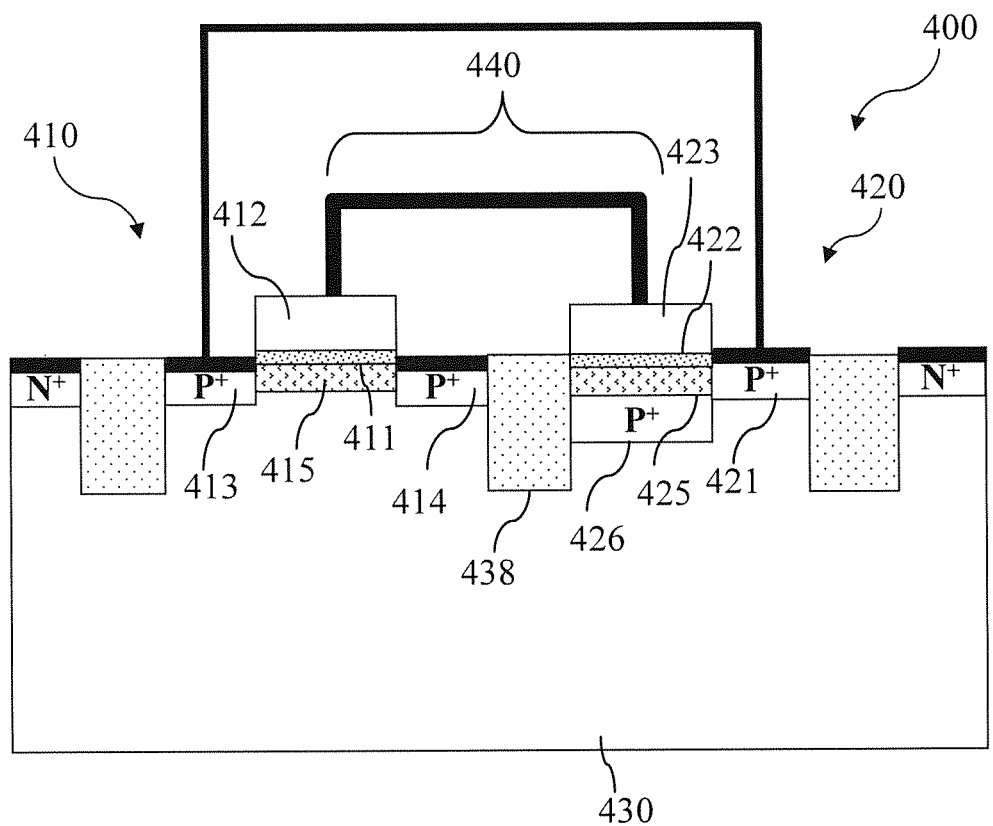
FIG. 5A is a sectional view schematically showing the structure of a non-volatile memory with a single gate-source common terminal according to a fourth embodiment of the present invention.

Refer to FIG. 5A a sectional view schematically showing the structure of a non-volatile memory with a single gate-source common terminal according to a fourth embodiment of the present invention.

In the fourth embodiment, the non-volatile memory 400 with a single gate-source common terminal comprises an N-type semiconductor substrate 430, an PMOS transistor (PMOSFET) 410 disposed in the N-type semiconductor substrate 430, and a P-type capacitor structure 420 disposed in the N-type semiconductor substrate 430. The PMOS transistor 410 includes a first dielectric layer 411 disposed on the N-type semiconductor substrate 430; a first electric-conduction gate 412 stacked on the first dielectric layer 411; two first ion-doped regions disposed inside the N-type semiconductor substrate 430 and respectively functioning as a source 413 and a drain 414, wherein a channel 415 is formed between the source 413 and the drain 414. The P-type capacitor structure 420 includes a second ion-doped region 421 disposed inside the N-type semiconductor substrate 430; a second dielectric layer 422 disposed on the lateral side of the second ion-doped region 421, wherein a channel 425 is formed below the second dielectric layer 422; a third ion-doped region 426 disposed below the channel 425; and a second electric-conduction gate 423 stacked on the second dielectric layer 422, whereby is formed a top plate-dielectric layer-bottom plate capacitor structure. The first electric-conduction gate 412 of the PMOS transistor 410 and the second electric-conduction gate 423 disposed on the upper lateral of the P-type capacitor structure 420 are electrically connected but mechanically separated by an isolation material 438 to form a single floating gate 440. Further, the source 413 is electrically connected with the second ion-doped region 421, whereby is formed a single common terminal of the source 413 and the single floating gate 440. In the fourth embodiment, the first ion-doped regions, the second ion-doped region 421 and the third ion-doped region 426 are P-type ion-doped regions.

Figure 5B:
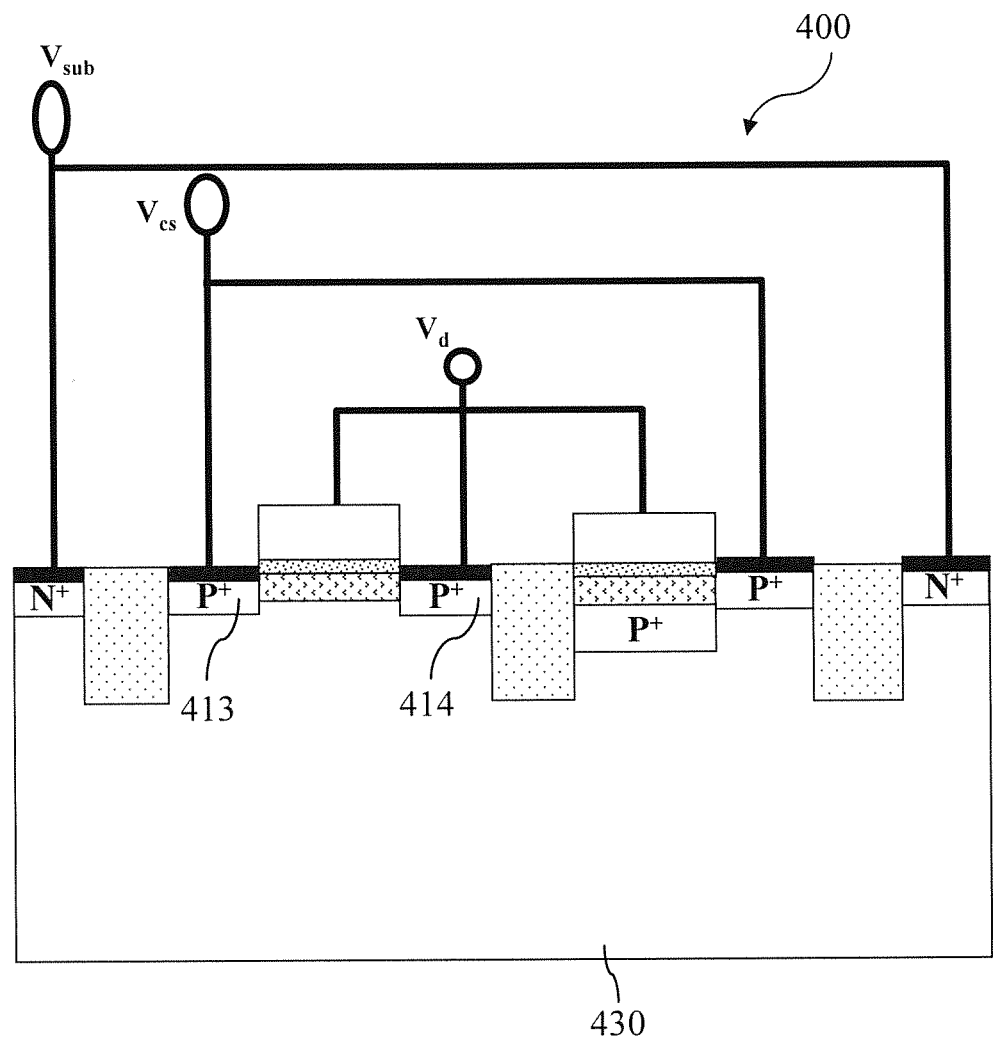
FIG. 5B is a diagram schematically showing the non-volatile memory with a single gate-source common terminal and having three terminals according to the fourth embodiment of the present invention.

The non-volatile memory 400 with a single gate-source common terminal is a three-terminal structure. Refer to FIG. 5B a diagram schematically showing the non-volatile memory 400 with a single gate-source common terminal and having three terminals according to the fourth embodiment of the present invention. The three terminals are respectively the N-type semiconductor 430, the source 413 and the drain 414. A substrate voltage $V_{sub}$, a control gate-source voltage $V_{cs}$, and a drain voltage $V_d$ are respectively applied to the N-type semiconductor 430, the source 413 and the drain 414. In the fourth embodiment, the non-volatile memory 400 with a single gate-source common terminal operates as follows:
In writing,
a. $V_{sub}>4V$;
b. $V_{cs}=V_{sub}$ and $V_d=0V$.
In erasing, a. $V_{sub}$>4V;

b. $V_{cs}$0V and $V_{sub}$>$V_d$; or $V_d$=0V and $V_{sub}$>$V_{cs}$ alternatively.

Figure 6A:
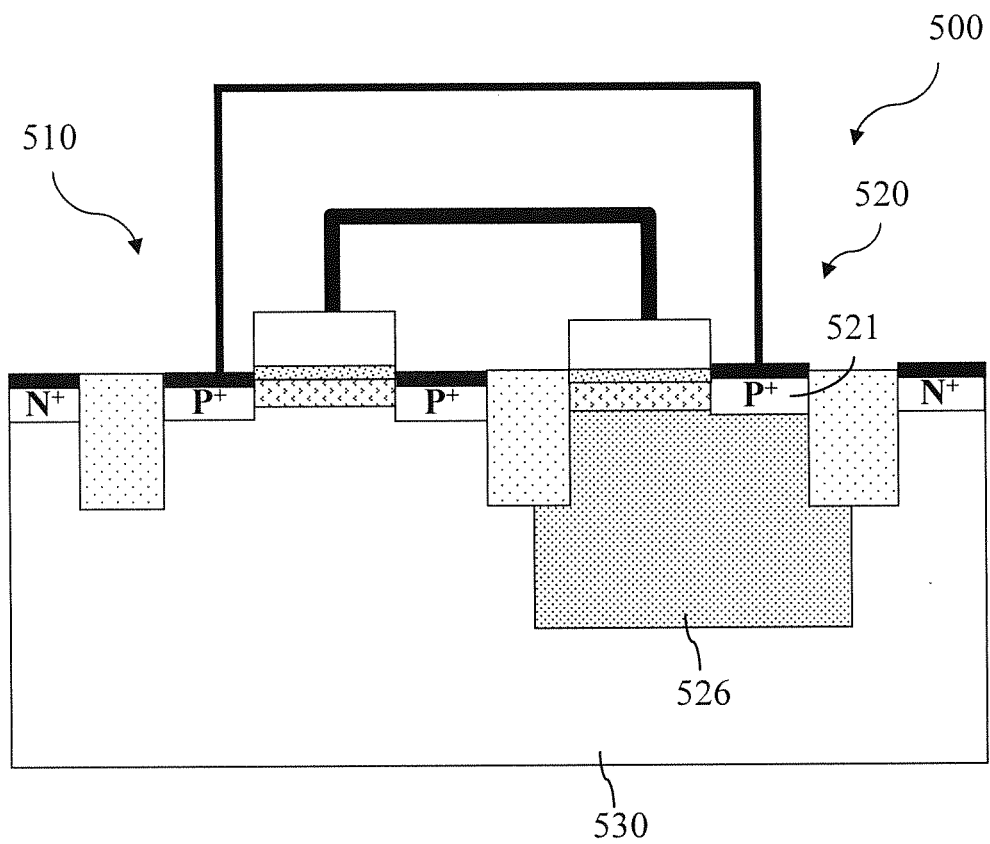
FIG. 6A is a sectional view schematically showing the structure of a non-volatile memory with a single gate-source common terminal according to a fifth embodiment of the present invention.

Refer to FIG. 6A a sectional view schematically showing the structure of a non-volatile memory with a single gate-source common terminal according to a fifth embodiment of the present invention.

In the fifth embodiment, the non-volatile memory 500 with a single gate-source common terminal comprises an N-type semiconductor substrate 530, a PMOS transistor (PMOSFET) 510 disposed in the N-type semiconductor substrate 530, and a P-type capacitor structure 520 disposed in the N-type semiconductor substrate 530. In the fifth embodiment, the first ion-doped regions and the second ion-doped region 521 are P-type ion-doped regions. The fifth embodiment is different from the fourth embodiment in that the third ion-doped region 526 is extended to below the second ion-doped region 521 to function as a P-type well.

Figure 6B:
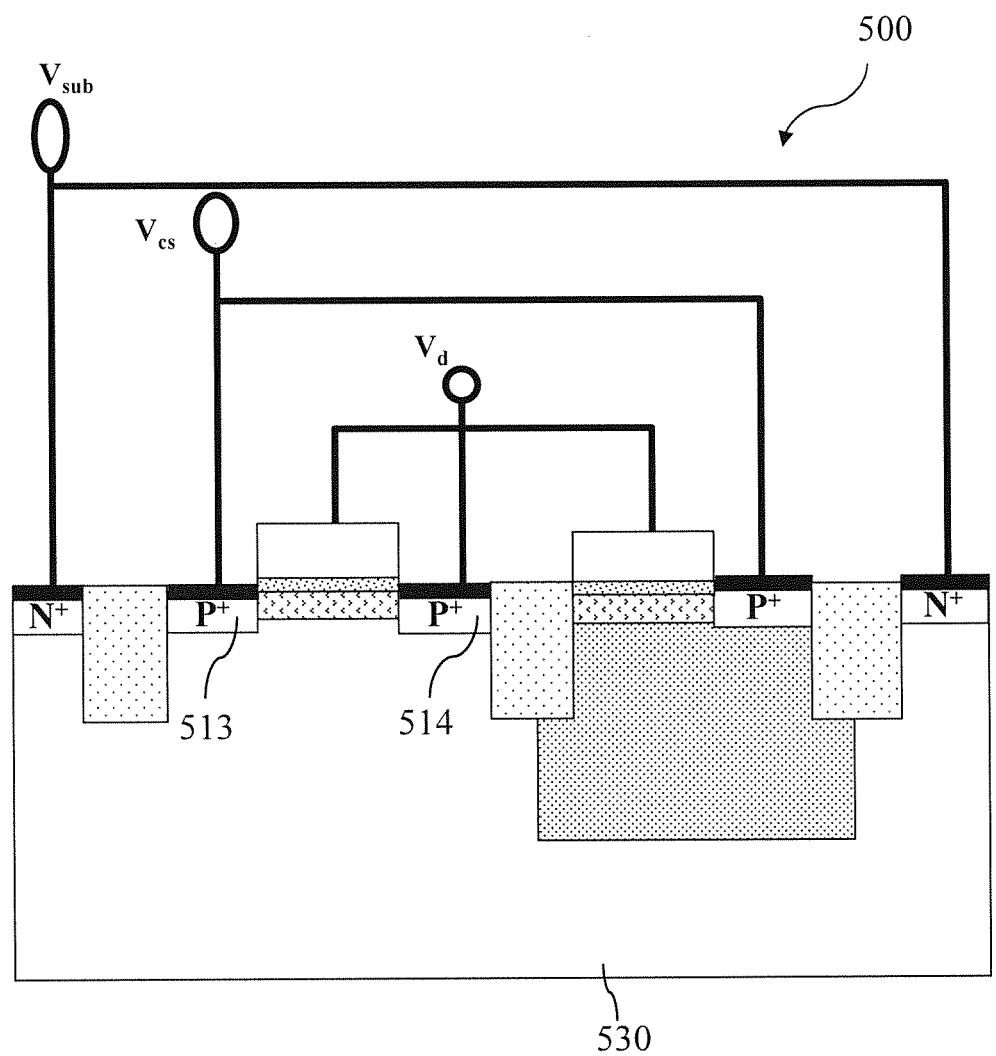
FIG. 6B is a diagram schematically showing the non-volatile memory with a single gate-source common terminal and having three terminals according to the fifth embodiment of the present invention.

The non-volatile memory 500 with a single gate-source common terminal is a three-terminal structure. Refer to FIG. 6B a diagram schematically showing the non-volatile memory 500 with a single gate-source common terminal and having three terminals according to the fifth embodiment of the present invention. The three terminals are respectively the N-type semiconductor 530, the source 513 and the drain 514. In writing or erasing the non-volatile memory 500 with a single gate-source common terminal, a substrate voltage $V_{sub}$, a control gate-source voltage $V_{cs}$, and a drain voltage $V_d$ are respectively applied to the N-type semiconductor 530, the source 513 and the drain 514. In the fifth embodiment, the operation process of the non-volatile memory 500 with a single gate-source common terminal must satisfy the conditions described in the fourth embodiment.

In the present invention, the non-volatile memory with a single gate-source common terminal y may alternatively comprise an N-type semiconductor substrate, a transistor, a P-type well and a capacitor structure. Similar to the non-volatile memories with a single gate-source common terminal described above, the non-volatile memory with a single gate-source common terminal and using a P-type well has or does not have a third ion-doped region below the capacitor structure. Below, a sixth embodiment is used to exemplify the non-volatile memory with a single gate-source common terminal and using a P-type well.

Figure 7A:
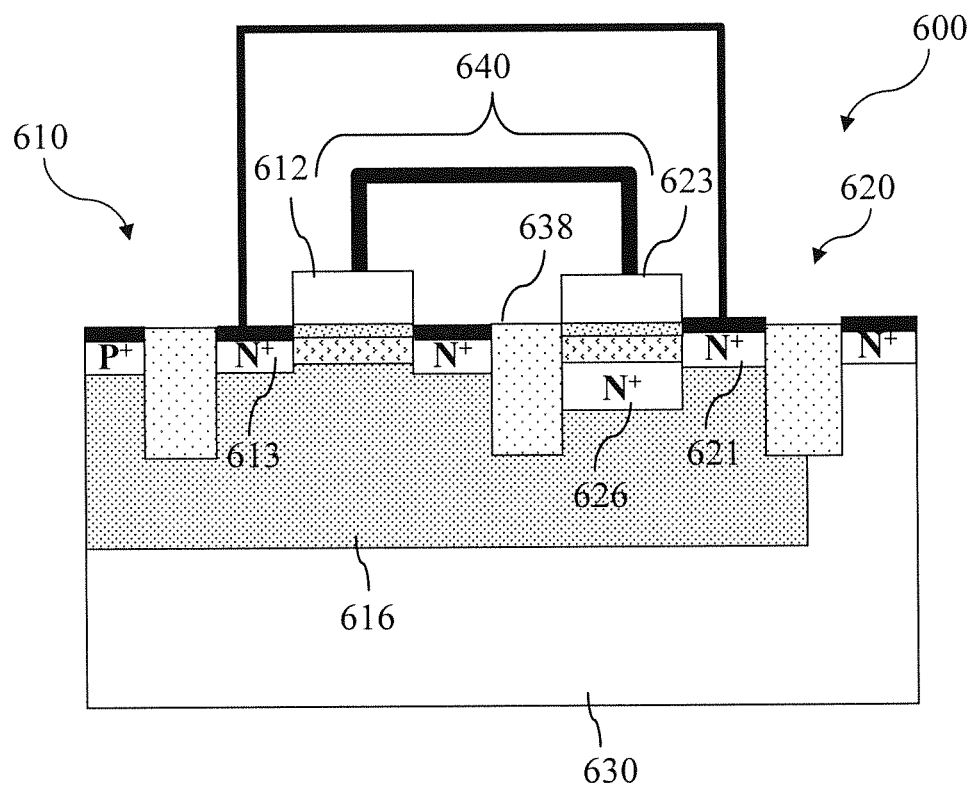
FIG. 7A is a sectional view schematically showing the structure of a non-volatile memory with a single gate-source common terminal according to a sixth embodiment of the present invention.

Refer to FIG. 7A a sectional view schematically showing the structure of a non-volatile memory with a single gate-source common terminal according to a sixth embodiment of the present invention.

In the sixth embodiment, the non-volatile memory 600 with a single gate-source common terminal comprises an N-type semiconductor substrate 630, an NMOS transistor (NMOSFET) 610 disposed in the N-type semiconductor substrate 630, and an N-type capacitor structure 620 disposed in the N-type semiconductor substrate 630. In the sixth embodiment, the first ion-doped regions, the second ion-doped region 621 and the third ion-doped region 626 are all N-type ion-doped regions. In the sixth embodiment, the memory 600 further comprises a fourth ion-doped region disposed below the first ion-doped regions and the second ion-doped region 621 and surrounding the NMOS transistor 610 and the N-type capacitor structure 620 to form a P-type well 616, wherein the fourth ion-doped region is a P-type ion-doped region. The first electric-conduction gate 612 of the NMOS transistor 610 and the second electric-conduction gate 623 disposed on the upper lateral of the N-type capacitor structure 620 are electrically connected but mechanically separated by an isolation material 638 to form a single floating gate 640. Further, the source 613 is electrically connected with the second ion-doped region 621, whereby is formed a single common terminal of the source 613 and the single floating gate 640.

Figure 7B:
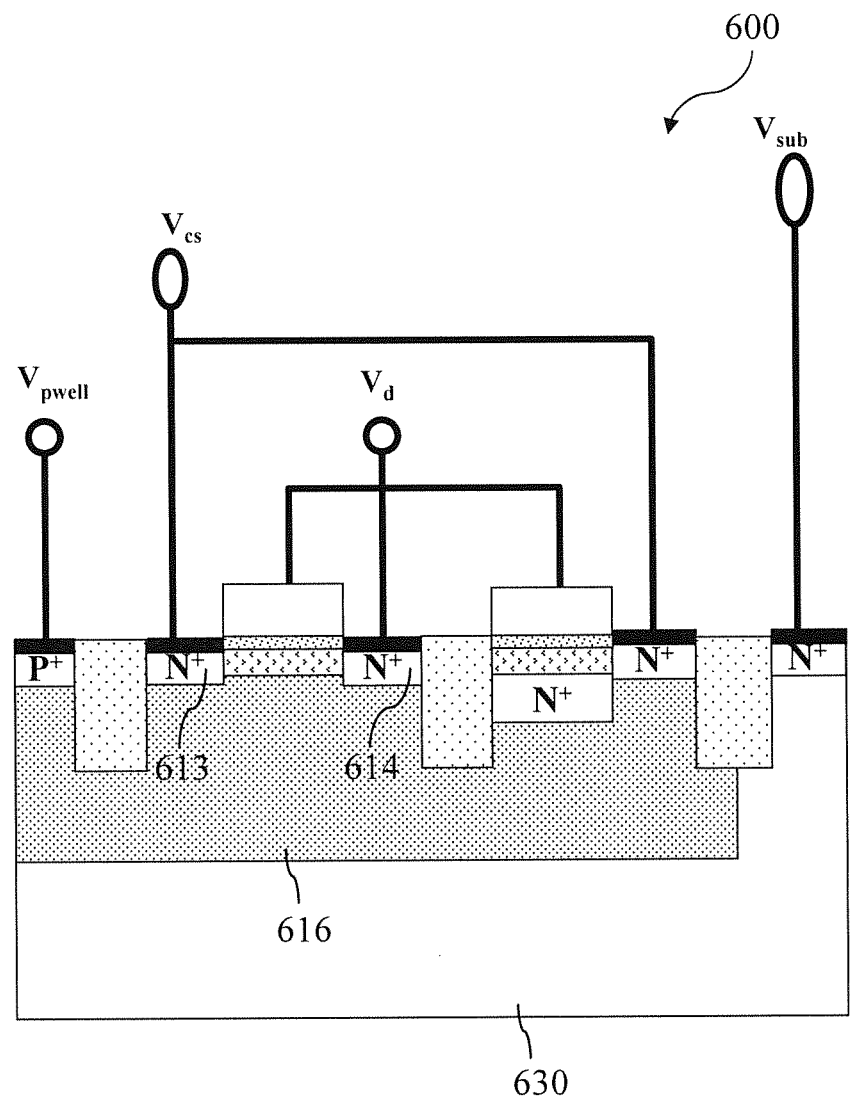
FIG. 7B is a diagram schematically showing the non-volatile memory with a single gate-source common terminal and having four terminals according to the sixth embodiment of the present invention.

The non-volatile memory 600 with a single gate-source common terminal is a four-terminal structure. Refer to FIG. 7B a diagram schematically showing the non-volatile memory 600 with a single gate-source common terminal and having four terminals according to the sixth embodiment of the present invention. The four terminals are respectively the N-type semiconductor 630, the P-type well 616, the source 613 and the drain 614. A substrate voltage $V_{sub}$, a P-type well voltage $V_{pwell}$, a control gate-source voltage $V_{cs}$, and a drain voltage $V_d$ are respectively applied to the N-type semiconductor 630, the P-type well 616, the source 613 and the drain 614, wherein the substrate voltage Vsub is a positive voltage. In the sixth embodiment, the non-volatile memory 600 with a single gate-source common terminal operates as follows:

In writing, a. $V_{pwell}$ is grounded;

b. $V_{cs}$=0V and $V_d$>4V.

In erasing, a. $V_{pwell}$ is grounded;

b. $V_{cs}$>4V and $V_d$<$V_{cs}$; or $V_d$>4V and $V_{cs}$<$V_d$ alternatively.

In the present invention, the non-volatile memory with a single gate-source common terminal may alternatively comprise a P-type semiconductor substrate, a transistor, an N-type well and a capacitor structure. Similar to the non-volatile memories with a single gate-source common terminal described above, the non-volatile memory 600 with a single gate-source common terminal and using an N-type well has or does not have a third ion-doped region below the capacitor structure. Below, a seventh embodiment is used to exemplify the non-volatile memory with a single gate-source common terminal and using an N-type well.

Figure 8A:
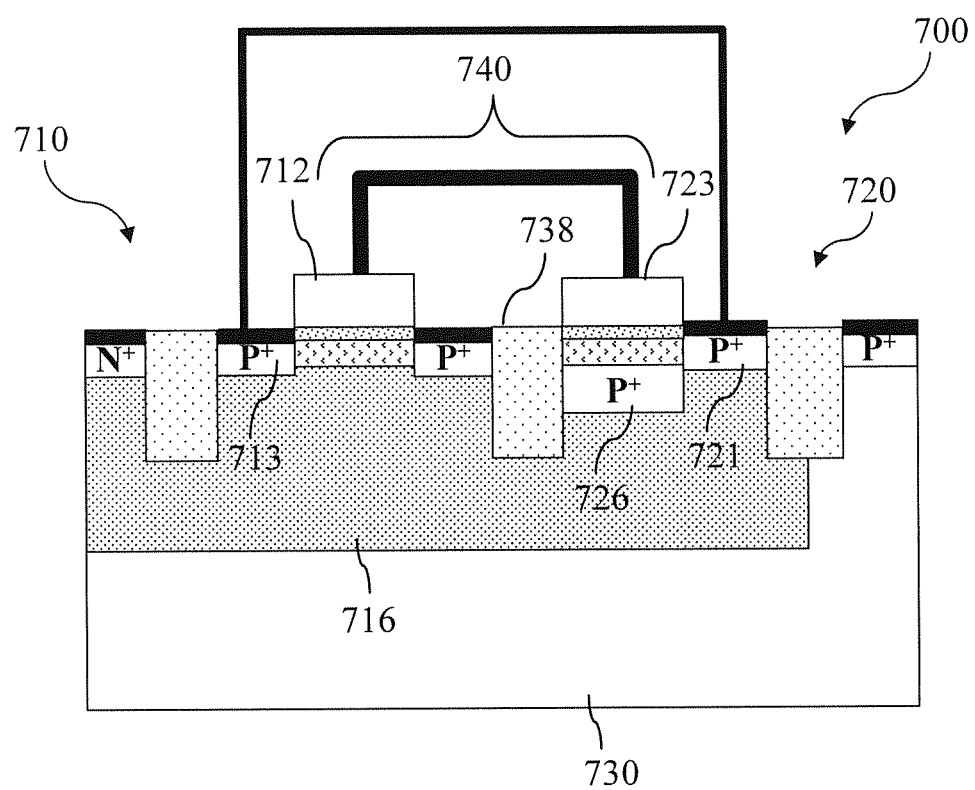
FIG. 8A is a sectional view schematically showing the structure of a non-volatile memory with a single gate-source common terminal according to a seventh embodiment of the present invention.

Refer to FIG. 8A a sectional view schematically showing the structure of a non-volatile memory with a single gate-source common terminal according to a seventh embodiment of the present invention.

In the seventh embodiment, the non-volatile memory 700 with a single gate-source common terminal comprises a P-type semiconductor substrate 730, a PMOS transistor (PMOSFET) 710 disposed in the P-type semiconductor substrate 730, and a P-type capacitor structure 720 disposed in the P-type semiconductor substrate 730. In the seventh embodiment, the first ion-doped regions, the second ion-doped region 721 and the third ion-doped region 726 are all P-type ion-doped regions. In the seventh embodiment, the memory 700 further comprises a fourth ion-doped region disposed below the first ion-doped regions and the second ion-doped region 721 and surrounding the PMOS transistor 710 and the P-type capacitor structure 720 to form an N-type well 716, wherein the fourth ion-doped region is an N-type ion-doped region. The first electric-conduction gate 712 of the PMOS transistor 710 and the second electric-conduction gate 723 disposed on the upper lateral of the P-type capacitor structure 720 are electrically connected but mechanically separated by an isolation material 738 to form a single floating gate 740. Further, the source 713 is electrically connected with the second ion-doped region 721, whereby is formed a single common terminal of the source 713 and the single floating gate 740.

Figure 8B:
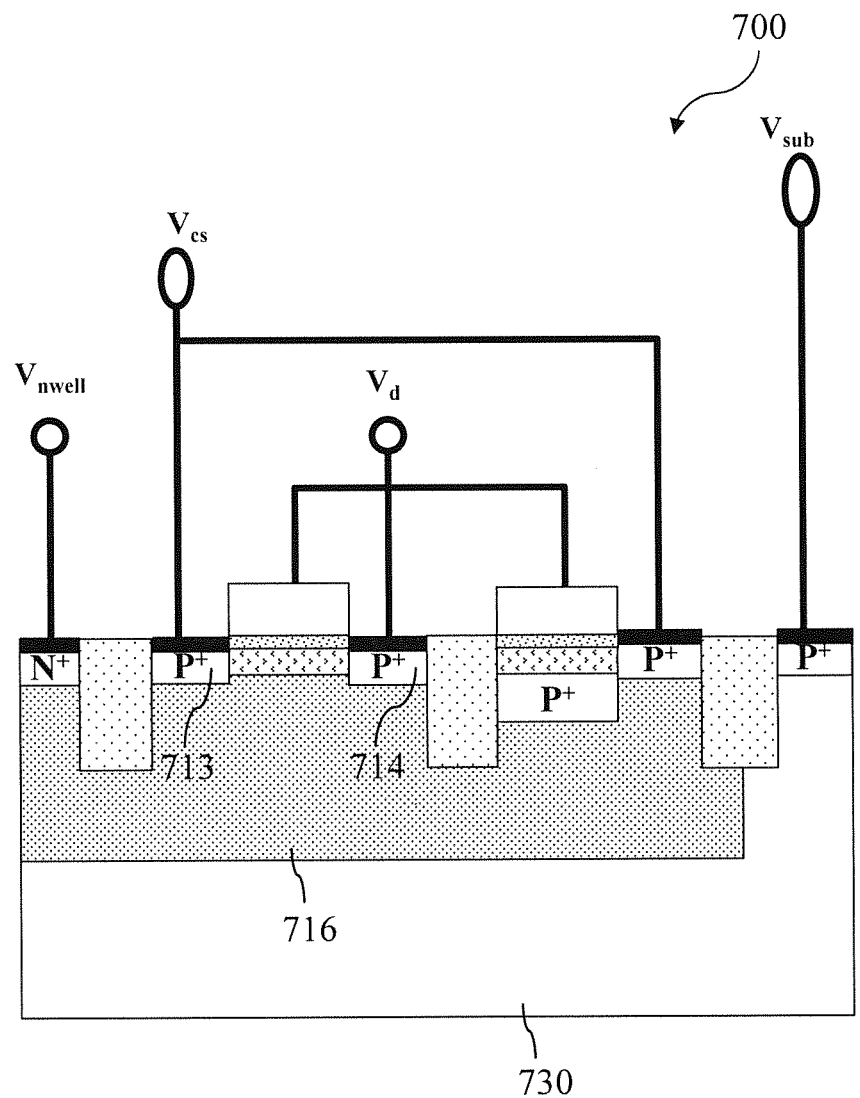
FIG. 8B is a diagram schematically showing the non-volatile memory with a single gate-source common terminal and having four terminals according to the seventh embodiment of the present invention.

The the non-volatile memory 700 with a single gate-source common terminal is a four-terminal structure. Refer to FIG. 8B a diagram schematically showing the non-volatile memory 700 with a single gate-source common terminal and having four terminals according to the seventh embodiment of the present invention. The four terminals are respectively the P-type semiconductor 730, the N-type well 716, the source 713 and the drain 714. A substrate voltage $V_{sub}$, an N-type well voltage $V_{nwell}$, a control gate-source voltage $V_{cs}$, and a drain voltage $V_d$ are respectively applied to the P-type semiconductor 730, the N-type well 716, the source 713 and the drain 714. In the seventh embodiment, the non-volatile memory 700 with a single gate-source common terminal operates as follows:

In writing,
a. $V_{nwell} > 4V$ and $V_{sub} = 0V$;
b. $V_{cs} = V_{nwell}$ and $V_d = 0V$.

In erasing,
a. $V_{nwell} > 4V$ and $V_{sub} = 0V$;
b. $V_{cs} = 0$ and $V_{nwell} > V_d$; or $V_d = 0V$ and $V_{nwell} > V_{cs}$ alternatively.

In contrast to an ordinary single-gate non-volatile memory whose gate, source and drain are independent, the present invention proposes a non-volatile memory whose source and single floating gate are connected to form a single gate-source common terminal. As the source and the single floating gate are biased by an identical voltage, the present invention can save the non-volatile memory a contact point of the control gate. Therefore, the present invention can greatly decrease the area and circuit length of a non-volatile memory and thus effectively reduce the fabrication cost thereof.

The embodiments described above are only to exemplify the present invention but not to limit the scope of the present invention. Any equivalent modification or variation according to the characteristic or spirit of the present invention is to be also included within the scope of the present invention.

What is claimed is:

1. A non-volatile memory with a single gate-source common terminal, comprising
a semiconductor substrate;
a transistor including a first dielectric layer, a first electric-conduction gate and a plurality of first ion-doped regions, wherein said first dielectric layer is disposed on said semiconductor substrate, and wherein said first electric-conduction gate is stacked on said first dielectric layer, and wherein said first ion-doped regions are respectively disposed at two sides of said first electric-conduction gate to function as a source and a drain; and
a capacitor structure including a second dielectric layer, a second ion-doped region and a second electric-conduction gate, wherein said second dielectric layer is disposed on said semiconductor substrate, and wherein said second electric-conduction gate is stacked on said second dielectric layer, and wherein said second ion-doped region and said first ion-doped regions are doped with an identical type of ions, and wherein said second ion-doped region is only disposed at one side of said second dielectric layer, and wherein a channel is formed below said second dielectric layer, and wherein said first electric-conduction gate and said second electric-conduction gate are electrically connected to form a single floating gate, and wherein said source and said second ion-doped region are electrically connected to form a single gate-source common terminal.

2. The non-volatile memory with a single gate-source common terminal according to claim 1, wherein said semiconductor substrate is a P-type semiconductor substrate, and wherein said first ion-doped regions and said second ion-doped region are N-type ion-doped regions.

3. The non-volatile memory with a single gate-source common terminal according to claim 1, wherein said semiconductor substrate is an N-type semiconductor substrate, and wherein said first ion-doped regions and said second ion-doped region are P-type ion-doped regions.

4. The non-volatile memory with a single gate-source common terminal according to claim 1 further comprising a third ion-doped region disposed inside said semiconductor substrate and below said channel, wherein said third ion-doped region and said second ion-doped region are doped with an identical type of ions.

5. The non-volatile memory with a single gate-source common terminal according to claim 4, wherein said third ion-doped region is extended to below said second ion-doped region.

6. The non-volatile memory with a single gate-source common terminal according to claim 1 further comprising a fourth ion-doped region disposed inside said semiconductor substrate and below said first ion-doped regions and said second ion-doped region, wherein said fourth ion-doped region is doped with a type of ions different from a type of ions said first ion-doped regions and said second ion-doped region are doped with.

7. An operation method of a non-volatile memory with a single gate-source common terminal, wherein said non-volatile memory comprises a P-type semiconductor substrate, a transistor and a capacitor structure, and wherein said transistor and said capacitor structure are disposed in said P-type semiconductor substrate, and wherein said transistor includes a first dielectric layer, a first electric-conduction gate and a plurality of first ion-doped regions, and wherein said first dielectric layer is disposed on said P-type semiconductor substrate, and wherein said first electric-conduction gate is stacked on said first dielectric layer, and wherein said first ion-doped regions are respectively disposed at two sides of said first electric-conduction gate to function as a source and a drain, and wherein said capacitor structure includes a second dielectric layer, a second ion-doped region and a second electric-conduction gate, and wherein said second dielectric layer is disposed on said P-type semiconductor substrate, and wherein said second electric-conduction gate is stacked on said second dielectric layer, and wherein said second ion-doped region and said first ion-doped regions are doped with an identical type of ions, and wherein said second ion-doped region is only disposed at one side of said second dielectric layer, and wherein a channel is formed below said second dielectric layer, and wherein said first electric-conduction gate and said second electric-conduction gate are electrically connected to form a single floating gate, and wherein said source and said second ion-doped region are electrically connected to form a single gate-source common terminal, and wherein said operation method is characterized in respectively applying a substrate voltage $V_{sub}$, a control gate-source voltage $V_{cs}$ and a drain voltage $V_d$ to said P-type semiconductor substrate, said source and said drain;

in writing said non-volatile memory, $V_{cs} = 0V$, $V_d > 4V$, and $V_{sub}$ grounded; and in erasing said non-volatile memory, $V_{cs} > 4V$, $V_d < V_{cs}$, and $V_{sub}$ grounded; or $V_d > 4V$, $V_{cs} < V_d$, and $V_{sub}$ grounded.

8. The operation method of a non-volatile memory with a single gate-source common terminal according to claim 7, wherein said non-volatile memory further comprises a third ion-doped region disposed inside said P-type semiconductor substrate and below said channel, wherein said third ion-doped region and said second ion-doped region are doped with an identical type of ions.

9. The operation method of a non-volatile memory with a single gate-source common terminal according to claim 8, wherein said third ion-doped region is extended to below said second ion-doped region.

10. An operation method of a non-volatile memory with a single gate-source common terminal, wherein said non-volatile memory comprises an N-type semiconductor substrate, a transistor, a P-type well and a capacitor structure, and wherein said transistor, said P-type well and said capacitor structure are disposed in said N-type semiconductor substrate, wherein said transistor includes a first dielectric layer, a first electric-conduction gate and a plurality of first ion-doped regions, and wherein said first dielectric layer is disposed on said N-type semiconductor substrate, and wherein said first electric-conduction gate is stacked on said first dielectric layer, and wherein said first ion-doped regions are respectively disposed at two sides of said first electric-conduction gate to function as a source and a drain, and wherein said capacitor structure includes a second dielectric layer, a second ion-doped region and a second electric-conduction gate, and wherein said second dielectric layer is disposed on said N-type semiconductor substrate, and wherein said second electric-conduction gate is stacked on said second dielectric layer, and wherein said second ion-doped region and said first ion-doped regions are doped with an identical type of ions, and wherein said second ion-doped region is only disposed at one side of said second dielectric layer, and wherein a channel is formed below said second dielectric layer, and wherein said P-type well is disposed below said first ion-doped regions and said second ion-doped region, and wherein said first electric-conduction gate and said second electric-conduction gate are electrically connected to form a single floating gate, and wherein said source and said second ion-doped region are electrically connected to form a single gate-source common terminal, and wherein said operation method is characterized in respectively applying a substrate voltage $V_{sub}$, a P-type well voltage $V_{pwell}$, a control gate-source voltage $V_{cs}$ and a drain voltage $V_d$ to said N-type semiconductor substrate, said P-type well, said source and said drain;

in writing said non-volatile memory, $V_{cs}=0V$, $V_d>4V$, and $V_{pwell}$ grounded; and in erasing said non-volatile memory, $V_{cs}>4V$, $V_d<V_{cs}$, and $V_{pwell}$ grounded; or $V_d>4V$, $V_{cs}<V_d$, and $V_{pwell}$ grounded.

11. The operation method of a non-volatile memory with a single gate-source common terminal according to claim 10, wherein said non-volatile memory further comprises a third ion-doped region disposed inside said N-type semiconductor substrate and below said channel, wherein said third ion-doped region and said second ion-doped region are doped with an identical type of ions.

12. An operation method of a non-volatile memory with a single gate-source common terminal, wherein said non-volatile memory comprises an N-type semiconductor substrate, a transistor and a capacitor structure, and wherein said transistor and said capacitor structure are disposed in said N-type semiconductor substrate, and wherein said transistor includes a first dielectric layer, a first electric-conduction gate and a plurality of first ion-doped regions, and wherein said first dielectric layer is disposed on said N-type semiconductor substrate, and wherein said first electric-conduction gate is stacked on said first dielectric layer, and wherein said first ion-doped regions are respectively disposed at two sides of said first electric-conduction gate to function as a source and a drain, and wherein said capacitor structure includes a second dielectric layer, a second ion-doped region and a second electric-conduction gate, and wherein said second dielectric layer is disposed on said N-type semiconductor substrate, and wherein said second electric-conduction gate is stacked on said second dielectric layer, and wherein said second ion-doped region and said first ion-doped regions are doped with an identical type of ions, and wherein said second ion-doped region is only disposed at one side of said second dielectric layer, and wherein a channel is formed below said second dielectric layer, and wherein said first electric-conduction gate and said second electric-conduction gate are electrically connected to form a single floating gate, and wherein said source and said second ion-doped region are electrically connected to form a single gate-source common terminal, and wherein said operation method is characterized in respectively applying a substrate voltage $V_{sub}$, a control gate-source voltage $V_{cs}$ and a drain voltage $V_d$ to said N-type semiconductor substrate, said source and said drain;

in writing said non-volatile memory, $V_{cs}=V_{sub}$, $V_d=0V$, and $V_{sub}>4V$; and in erasing said non-volatile memory, $V_{cs}=0V$, $V_{sub}>V_d$, and $V_{sub}>4V$; or $V_d=0V$, $V_{sub}>V_{cs}$, and $V_{sub}>4V$.

13. The operation method of a non-volatile memory with a single gate-source common terminal according to claim 12, wherein said non-volatile memory further comprises a third ion-doped region disposed inside said N-type semiconductor substrate and below said channel, wherein said third ion-doped region and said second ion-doped region are doped with an identical type of ions.

14. The operation method of a non-volatile memory with a single gate-source common terminal according to claim 13, wherein said third ion-doped region is extended to below said second ion-doped region.

15. An operation method of a non-volatile memory with a single gate-source common terminal, wherein said non-volatile memory comprises a P-type semiconductor substrate, a transistor, an N-type well and a capacitor structure, and wherein said transistor, said N-type well and said capacitor structure are disposed in said P-type semiconductor substrate, wherein said transistor includes a first dielectric layer, a first electric-conduction gate and a plurality of first ion-doped regions, and wherein said first dielectric layer is disposed on said P-type semiconductor substrate, and wherein said first electric-conduction gate is stacked on said first dielectric layer, and wherein said first ion-doped regions are respectively disposed at two sides of said first electric-conduction gate to function as a source and a drain, and wherein said capacitor structure includes a second dielectric layer, a second ion-doped region and a second electric-conduction gate, and wherein said second dielectric layer is disposed on said P-type semiconductor substrate, and wherein said second electric-conduction gate is stacked on said second dielectric layer, and wherein said second ion-doped region and said first ion-doped regions are doped with an identical type of ions, and wherein said second ion-doped region is only disposed at one side of said second dielectric layer, and wherein a channel is formed below said second dielectric layer, and wherein said N-type well is disposed below said first ion-doped regions and said second ion-doped region, and wherein said first electric-conduction gate and said second electric-conduction gate are electrically connected to form a single floating gate, and wherein said source and said second ion-doped region are electrically connected to form a single gate-source common terminal, and wherein said operation method is characterized in respectively applying a substrate voltage $V_{sub}$, an N-type well voltage $V_{nwell}$, a control gate-source voltage $V_{cs}$ and a drain voltage $V_d$ to said P-type semiconductor substrate, said N-type well, said source and said drain;

in writing said non-volatile memory, $V_{nwell}>4V$, $V_{sub}=0V$, $V_{cs}=V_{nwell}$, and $V_d=0V$; and in erasing said non-volatile memory, $V_{nwell}>4V$, $V_{sub}=0V$, $V_{cs}=0V$, and $V_{nwell}>V_d$; or $V_{nwell}>4V$, $V_{sub}=0V$, $V_d=0V$, and $V_{nwell}>Vcs$.

16. The operation method of a non-volatile memory with a single gate-source common terminal according to claim 15, wherein said non-volatile memory further comprises a third ion-doped region disposed inside said P-type semiconductor substrate and below said channel, wherein said third ion-doped region and said second ion-doped region are doped with an identical type of ions.

* * * * *